United States Patent

Siebold et al.

[11] Patent Number: 5,729,188
[45] Date of Patent: Mar. 17, 1998

[54] HOMOGENEOUS FIELD MAGNET WITH AT LEAST ONE POLE PLATE TO BE MECHANICALLY ALIGNED

[75] Inventors: Horst Siebold; Günter Ries; Rudolf Röckelein, all of Erlangen, Germany

[73] Assignee: Siemens Aktiengesellschaft, München, Germany

[21] Appl. No.: 798,495

[22] Filed: Nov. 26, 1991

[30] Foreign Application Priority Data

Nov. 30, 1990 [DE] Germany .......................... 40 38 265.6

[51] Int. Cl.⁶ ............................................ H01F 7/00
[52] U.S. Cl. ...................... 335/298; 324/319; 335/297
[58] Field of Search ................................ 335/210–214, 335/296–298, 301–306; 324/318, 319, 320

[56] References Cited

U.S. PATENT DOCUMENTS

| | | | |
|---|---|---|---|
| 2,664,527 | 12/1953 | Reed | 335/296 |
| 4,679,022 | 7/1987 | Miyamoto | 335/296 |
| 4,707,663 | 11/1987 | Minkoff et al. | 324/319 |
| 4,870,380 | 9/1989 | McGinley | 335/296 |
| 5,003,276 | 3/1991 | Sarwinski | 335/304 |
| 5,061,897 | 10/1991 | Danby et al. | 324/318 |

FOREIGN PATENT DOCUMENTS

| | | |
|---|---|---|
| 0 161 782 | 11/1985 | European Pat. Off. . |
| 37 37 133 | 5/1989 | Germany . |
| 3737133 | 5/1989 | Germany . |

*Primary Examiner*—Leo P. Picard
*Assistant Examiner*—Ramon M. Barrera
*Attorney, Agent, or Firm*—Kenyon & Kenyon

[57] ABSTRACT

A magnet contains a magnetic yoke and two pole shoes, between which a magnetic field of great homogeneity is formed. The pole shoes are provided with special pole plates. At least one pole plate (11d) is separated from a base part (11b) facing the yoke by a narrow correction air gap (15), and can be aligned by means of mechanical setting devices. According to the invention, each pole shoe (11) has a bead-like edge piece (11c) for field correction at its edge area (17b), which surrounds an inner pole shoe area (17a). In this region, the pole plate (11d), which can be aligned laterally separated from the edge piece (21).

27 Claims, 4 Drawing Sheets

HOMOGENEOUS FIELD MAGNET WITH AT LEAST ONE POLE PLATE TO BE MECHANICALLY ALIGNED

BACKGROUND OF THE INVENTION

The invention relates to a homogeneous field magnet with a yoke which carries the magnetic flux and two opposite pole shoes, between which an active volume with a magnetic field of great homogeneity is formed. The pole shoes are each profiled on the side facing the active volume. At least one of the pole shoes is provided with a pole plate which is separated from a base part of the pole shoe by a narrow correction air gap. The base part faces the yoke. The pole plate can be tilted and/or bent to correct the magnetic field, by means of mechanical setting devices. A corresponding homogeneous field magnet is known, for example, from DE-OS 3737133.

Homogeneous field magnets are needed to generate primary magnetic fields in systems for nuclear resonance tomography (nuclear magnetic resonance tomography, magnetic resonance imaging or magnetic resonance spectroscopy). The magnetic field of such primary field magnets must be sufficiently homogeneous within an imaging or examination range (active volume) and generate a predetermined magnetic induction $B_o$ there. For magnetic inductions $B_o > 0.5$ T, superconductive coil systems are generally provided. In contrast, lower magnetic inductions ($B_o < 0.5$ T) can also be generated with standard conductive coils or permanent magnets. The latter are formed, in many cases, as pole shoe magnets with an iron yoke in the form of a "C". The active volume with the required field homogeneity then lies between the pole surfaces of the opposite pole shoes.

The field homogeneity which can initially be achieved in the active volume is not sufficient for the requirements of magnetic resonance tomography due to unavoidable production tolerances. Therefore, there has to be a correction possibility in the finished magnet, in order to be able to successively reduce variations of the field homogeneity. Such a correction may be made by means of an alternating sequence of field measurements and field corrections (shimming).

The European Patent Application EP-A-0161782 shows a permanently excited pole shoe magnet which has a number of mechanical field correction possibilities. In the area of the pole surfaces, its pole shoes are structured as adjustable pole plates which are profiled at their surfaces facing the active volume, in such a way that marginal effects which influence homogeneity, in particular, are compensated. The pole shoes are therefore provided with edge pieces in the form of bead-like elevations in their edge areas to reduce the distance between the pole shoes. The two pole plates rest directly against the permanent magnet assigned to them, i.e. against flux-carrying parts of an iron yoke.

In order to be able to align such profiled pole plates relative to one another with sufficient accuracy, and to correct field errors, at least one of the pole plates is not attached directly to the iron yoke carrying a magnetic flux, in the homogeneous field magnet as is evident from the reference DE-OS 3737133 mentioned initially. Rather, the profiled pole plate is separated from a base part of the pole shoe facing the yoke by a narrow correction air gap, where it is structured so it can be tilted and/or bent by means of special setting devices. The air gap acts to homogenize the field, as a magnetic series resistor, in that it equalizes flux density non-homogeneity in flux conducting parts of the pole shoe during the flux transition into the pole plate in each case.

SUMMARY OF THE INVENTION

The present invention further improves and simplifies the mechanical field correction possibilities of conventional homogeneous field magnets. Only a relatively slight magnetic flux density is supposed to be present in the plane of the pole plate in order to allow good diffusion of additional magnetic flux. These are produced, in particular, by pulsed gradient fields for magnetic resonance tomography. Non-linearities of these gradient fields are supposed to be avoided to a great extent.

By providing each pole shoe with an edge piece as part of its magnetic pole shoe assembly, and by arranging this pole plate <-> and separate and from the inner area <surrounded by the edge piece> by a lateral gap relative to the edge piece when at least one pole shoe is provided with a tiltable and/or bendable pole plate, the present invention will attain the aforementioned desirable characteristics. The edge pieces serve to reduce the distance between the pole shoes at their edge area.

The ability to produce at least the one pole plate in an extremely simple manner is one particular advantage connected with this structure of the homogeneous field magnet. In the present invention, the pole plate demonstrates great mechanical flexibility, which requires relatively slight expenditure of effort for mechanical setting devices for homogenization of the magnetic primary field. This makes it possible to guarantee a very precise setting accuracy. Since the pole plate is uncoupled magnetically from the pole shoe and its edge piece, a clear reduction in the radial flux density component in the pole plate, especially in its edge zone, is achieved. The pole shoe and its edge piece now essentially carry the radial magnetic flux. In this way, gradient fields can be switched on extensively without delay.

Further advantageous forms of the homogeneous field magnet according to the invention are evident from the dependant claims.

In the figures, the same reference symbol is used for parts which correspond to each other.

DETAILED DESCRIPTION

Parts of the present invention that are well known to those familiar with conventional homogeneous field magnets and their use in magnetic resonance tomography will not be explained in great detail. The magnet of the present invention is structured as a pole shoe magnet, demonstrating the following general structural characteristics:

a) the pole surfaces of the pole shoes which face each other, may have a round, square or rectangular pole surface and are profiled or textured according to the homogeneity field requirements;

b) at least one of its two pole shoes comprises a special pole plate in the pole shoe's middle, central area, which is separated from the pole shoe's base part by means of a correction air gap;

c) to generate the magnetic field, either exciter coils or permanent magnets are provided, the exciter coils or permanent magnets being generally arranged close to the pole shoes;

d) the pole shoes are connected via a yoke carrying the magnetic flux, the yoke being made of a corresponding magnetic material and can be structured with one shank or several shanks;

e) the measurements according to the invention for mechanical shimming are provided.

Figure 1:
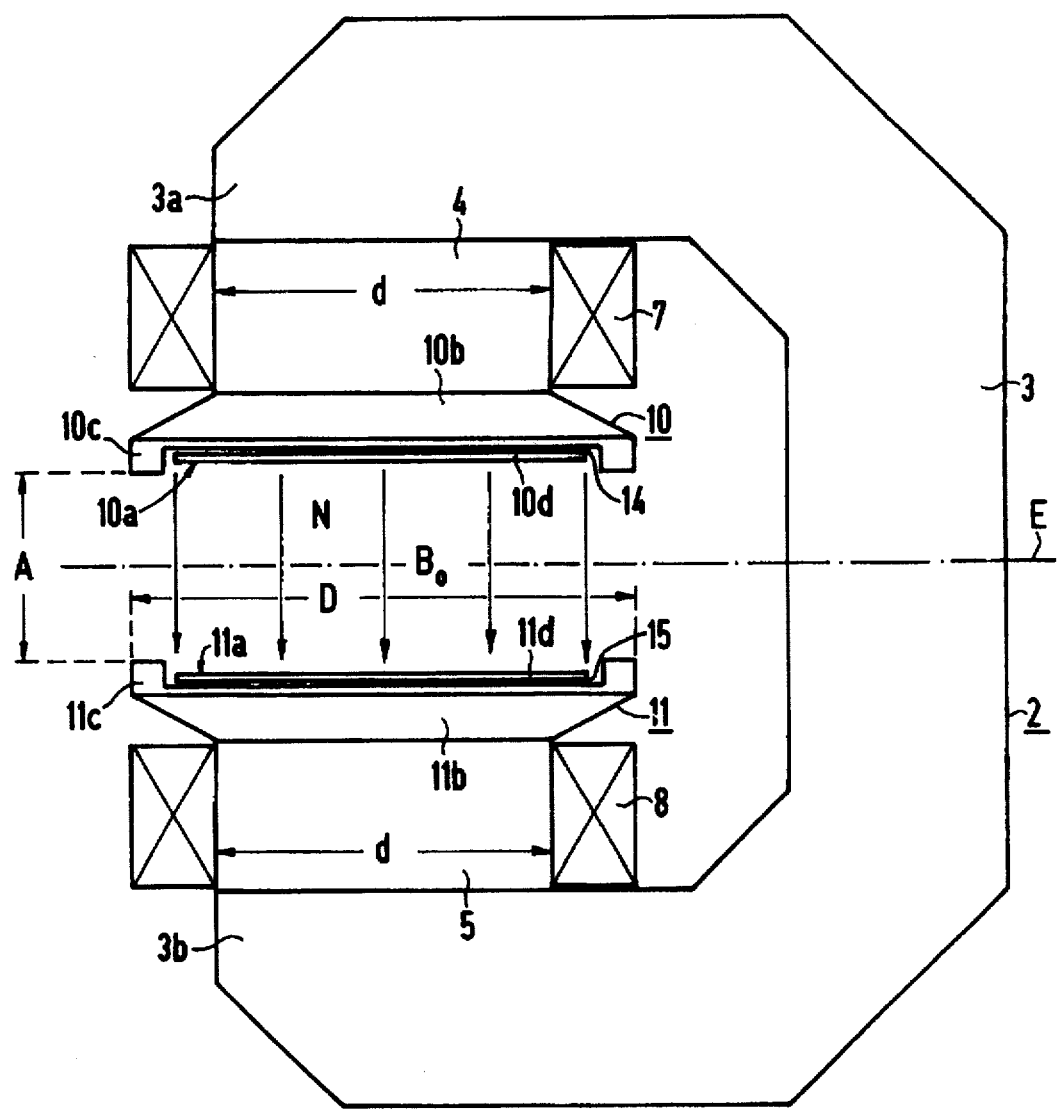
FIG. 1 shows a homogeneous field magnet according to an embodiment of the present invention.

A magnet according to the present invention and these characteristics, is the basis for a homogeneous field magnet and is shown in the schematic longitudinal cross-section of FIG. 1. This magnet, generally designated as 2, has a one-shank magnetic yoke 3, which can be made of iron. It is often also called a C-magnet, because of the shape of its yoke 3. The two opposite, free shank ends 3a and 3b of the yoke 3 open into at least approximately cylindrical core and 5, respectively, of ferromagnetic material. These cores, leading towards each other, with a diameter d, are each surrounded by their own exciter coil 7 and 8, respectively. At the sides of the cores facing away from the shank ends 3a and 3b, the two cores 4 and 5 each pass over into a pole shoe 10 and 11, respectively. The pole shoe diameter D is greater than each of the core diameters d. In this way, the entire magnet 2 has an extensively symmetrical structure relative to a plane of symmetry E.

Between the pole surfaces 10a and 11a of the two pole shoes 10 and 11, which lie at least essentially parallel to the plane of symmetry E at a predetermined distance A, there is an intermediate space or active volume N. In this active volume, a magnetic field which is sufficiently homogeneous for magnetic resonance tomography is supposed to prevail. This magnetic field is produced by the two exciter coils 7 and 8. With normally conductive coils, magnetic inductions $B_o$ (indicated with arrow lines) can be achieved in the active volume. The indicators are limited by the saturation magnetization of the yoke material and are thus below 0.5 T, for example.

Each of the pole shoes 10 and 11 contains a base part 10b and 11b, respectively, conducting the magnetic field and connected with the yoke 3 via the cores 4 and 5, respectively. Each base part 10b and 11b has a flat, free surface except for its edge area. This edge area has a bead-like edge piece 10c or 11c which reduces the distance A. These ring-shaped edge pieces provide field correction at the outer edge of the pole shoes and are therefore also designated as "field correction rings." In an inner (central) area of at least one of the pole shoes, surrounded by these edge pieces, but preferably in both pole shoes, a special pole plate 10d or 11d is arranged. Each pole plate is supposed to be separated from its assigned base part by a narrow correction air gap. In the figure, the correction gap located between the base part 10b and the pole plate 10d is designated as 14. Correspondingly, the correction gap 15 lies between the base part 11b and the pole plate 11d. In general, there are gradient coils (not shown in the figure) in the immediate vicinity of the surfaces 10a and 11a of the pole plates 10d and 11d respectively which face the active volume area N, to generate the pulsed gradient fields required for magnetic resonance tomography.

Figure 2:
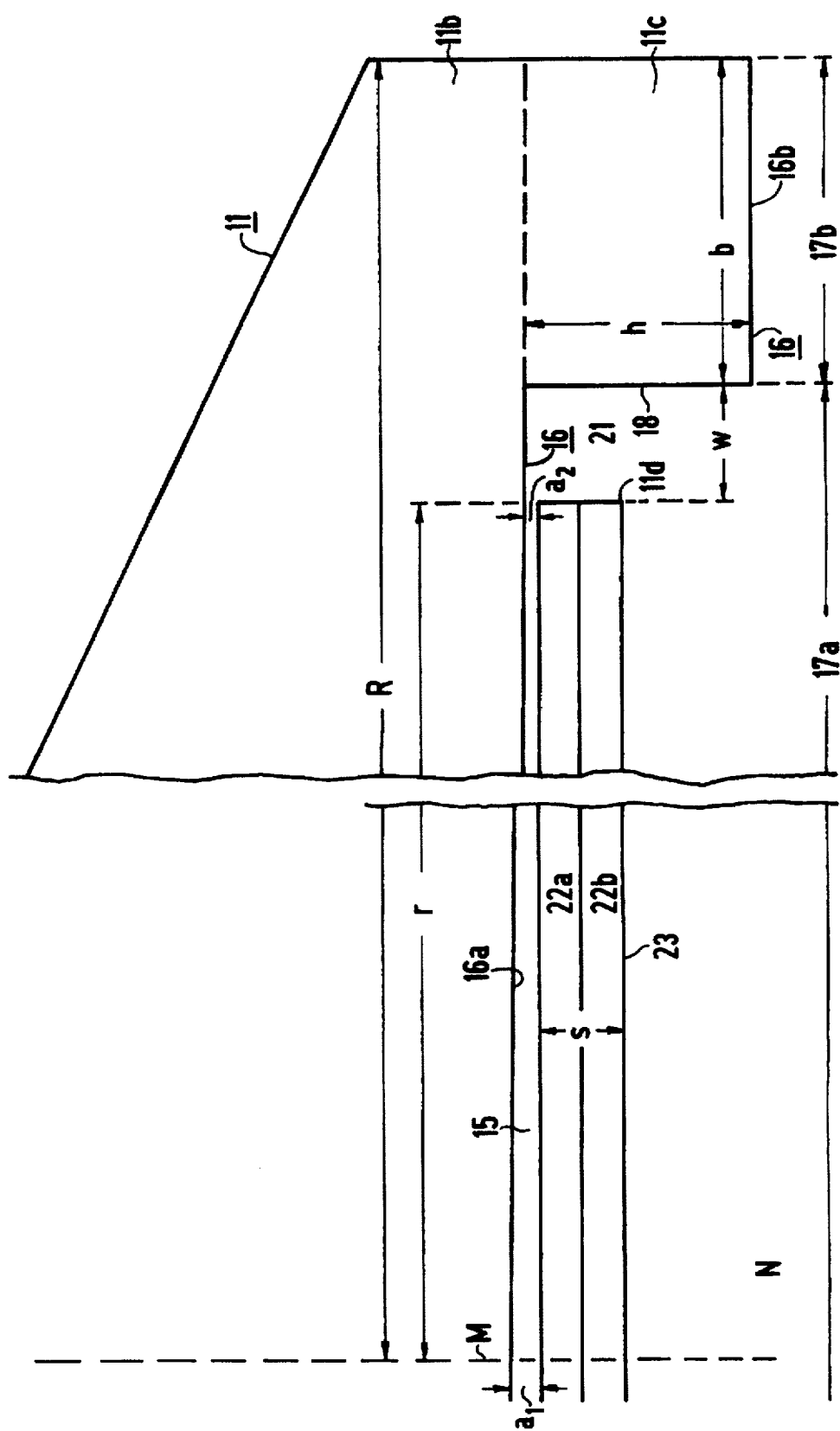
FIG. 2 shows an enlarged segment of a pole shoe of the magnet shown in FIG. 1.

Further structural characteristics of the profile base parts as well as the pole plates are evident from the longitudinal cross-section shown in FIG. 2. In this figure, an enlarged segment of the pole shoe 11 of the magnet 2 according to FIG. 1 is shown. Corresponding structural characteristics can also be provided for the pole shoe 10. It is also possible, however, that the base part 10b and the pole plate 10d are structured as a single profiled component with a correspondingly textured surface 10a.

In the cross-section through a part of the pole shoe 11 shown in FIG. 2, the base part 11b, with an essentially trapezoid cross-sectional area and a stepped surface 16, can be seen. This part 11b represents the extension of a ferromagnetic core (5) (not shown in the figure), for example in cylindrical shape, which is surrounded by a normal conductive exciter coil (8) (not shown in the figure). If necessary, this core and the base part 11b can form a common component. The surface 16 of the base part 11b is divided into a middle surface part 16a corresponding to a middle, central pole area 17a, and an outer surface part 16b corresponding to an edge area 17b. Between these two areas there is a step 18, so that an edge piece 11c of the base part, for example with a rectangular cross-sectional area, results. The height h of the edge piece 11c, i.e. the distance between the planes of the middle surface part 16a and the outer surface part 16b at the step 18, can amount to between 20 and 50 mm, for example approximately 40 mm. The radial width b of the edge piece 11c or the outer surface part 16b generally lies between 40 and 80 mm, for example approximately 60 mm. The cross-sectional area of the edge piece 11c can also have a different shape, for example trapezoidal. The edge piece can be attached to the base part 11b as a separate component, for example. In this case, the edge piece may be produced from a material with magnetic properties that are different from those of the remaining base part. According to the embodiment shown, however, it is assumed that the edge piece 11c forms a common molded piece with the base part 11b.

In the middle, central pole area 17a, the pole plate 11d is arranged separated from the surface part 16a by a narrow correction air gap 15. A radial gap with a width w is supposed to remain between the outside edge of the plate and the edge piece 11c. The gap width w generally lies approximately between 2 and 20 mm. In general, the pole plate 11d should take up less than 85% of the entire surface 16 of the pole shoe 11. For a base part with rotational symmetry with regard to a line (axis) M through its center, the radius r of the pole plate 11d may be defined by: r<0.9·R, where R is the maximum outside radius of the base part 11b or its edge piece 11c. Setting devices for fixation as well as for tilting and/or bending of the pole plate 11d are sufficiently known (see reference DE-OS 3737133 as mentioned). Therefore these devices were not shown in FIG. 2. It is advantageous if the pole 11d has a rectangular cross-sectional area, being structured to be relatively thin. Thus, its constant thickness s lies between 3 mm and 30 mm, preferably between 5 mm and 15 mm. It is advantageous if a magnetic material with great relative permeability $\mu_r$ and great flux carrying capacity $B_{max}$ is selected for the plate 11d, at least in part. Thus, for example, a solid, magnetically isotropic plate made of a Si—Fe alloy with $\mu_r \approx 4000$ and $B_{max} \approx 1.6$ T can be used. This material has an electrical conductivity of approximately $2.5 \cdot 10^6$ S/m. Corresponding pole plates are particularly easy to manufacture.

To provide a more mechanically flexible pole plate than a pole plate of a solid material, it is advantageous to structure the pole plate 11d from a stack of several sheets of metal, e.g. conventional electric sheets of a Si—Fe alloy, with a thickness between approximately 1 mm and 5 mm for each sheet.

Figure 3:
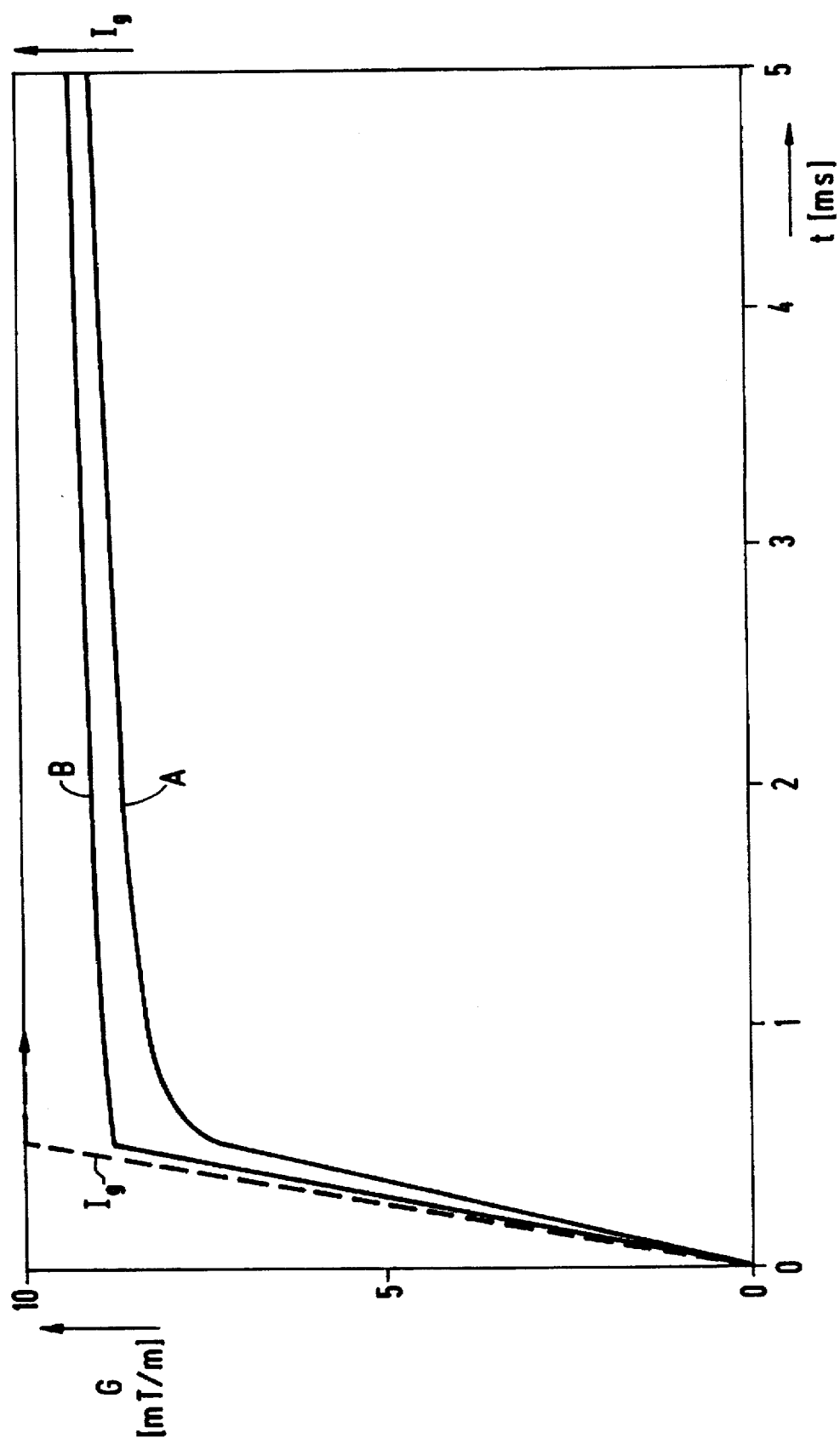
FIG. 3 shows the time progression of gradient field intensity at pole plates of corresponding homogeneous field magnets.

Furthermore, as was assumed for the embodiment according to FIG. 2, the pole plate 11d can have a layer structure of two layers 22a and 22b with approximately the same thickness, where different materials are selected for these layers. The first layer 22a, which faces the correction air gap 15, can be produced from one or more electric sheets of a Si—Fe alloy, each 1 to 5 mm thick, for example, so that sufficient flexibility of the overall structure is guaranteed. In contrast, the second layer 22b, which faces the active volume N, can consist, for example, of a soft-magnetic ferrite or a plastic-bonded iron powder. With a relative permeability $\mu_r$ of approximately 1000 and flux carrying capacity $B_{max}$ of approximately 0.4 T to 0.5 T, it is possible to guarantee only slight electrical conductivity of this layer, in an advantageous manner. The first, highly permeable layer 22a provides good primary field homogeneity. The second layer 22b carries the additional magnetic flux, which is caused during the pulse increase time of the gradient current of the gradient coils required for magnetic resonance tomography, for short periods of time. These gradient coils, not shown in FIG. 2, are located, in a known manner, in the immediate vicinity of the surface 23 of the layer 22b facing the active volume N. With the layer structure shown, the gradient field can be switched on almost without delay, in an advantageous manner. This is because the magnetic diffusion processes which causes the pulse shape to loop, such as they occur in the case of a pole plate of purely ferromagnetic and electrically conductive material, are essentially suppressed. This characteristic can be seen in the diagram of FIG. 3. In this diagram, the time t (in ms) is entered in the direction of the abscissa, and the gradient field intensity G (in mT/m) to be measured is entered in the direction of the ordinate, for a specific embodiment. The curve designated as A relates to a pole plate of solid electric sheet, while the curve designated as B relates to a pole plate 11d with the structure of the layers 22a and 22b, with a different magnetic behavior and a different electrical conductivity, as shown in FIG. 2 and explained above. Furthermore, the time progression of a pulse of the gradient current $I_g$ is indicated with a broken line. As shown in FIG. 3 it has increased to its maximum value in about 0.5 ms. With this, the amount of this current in the ordinate direction is given in arbitrary units. As is evident from a comparison of the curves A and B, the stationary value of the gradient field intensity is reached significantly quicker when the pole plate 11d has a layered structure (Curve B) than when the pole plate is a uniformly magnetic material which is electrically conductive (Curve A). In the case of the latter pole plate, it is necessary to wait significantly longer to use its gradient field since the transient time of the pulse is significantly longer.

Furthermore, as is evident from FIG. 2, it is advantageous if the distance (i.e. the width) between the middle surface part 16a of the base part 11b and the pole plate 11d in the correction air gap 15 is not constant over the entire radial expanse. Rather, it is preferable for the distance $a_1$ in the area of the central axis M to be greater than the distance $a_2$ in the area of the outside edge of the plate. While $a_1$ generally lies between 3 and 5 mm, $a_2$ is at least 20%, preferably at least 30%, and at most 60% smaller than $a_1$. The difference $a_1-a_2$ can lie between 1 and 2 for example. The decrease in distance from $a_1$ to $a_2$ can be achieved, in particular, by corresponding conical lathing (milling) of the base part 11b. The decrease in distance does not have to be continuous, rather, a step-like decrease can also be provided.

Figure 4:
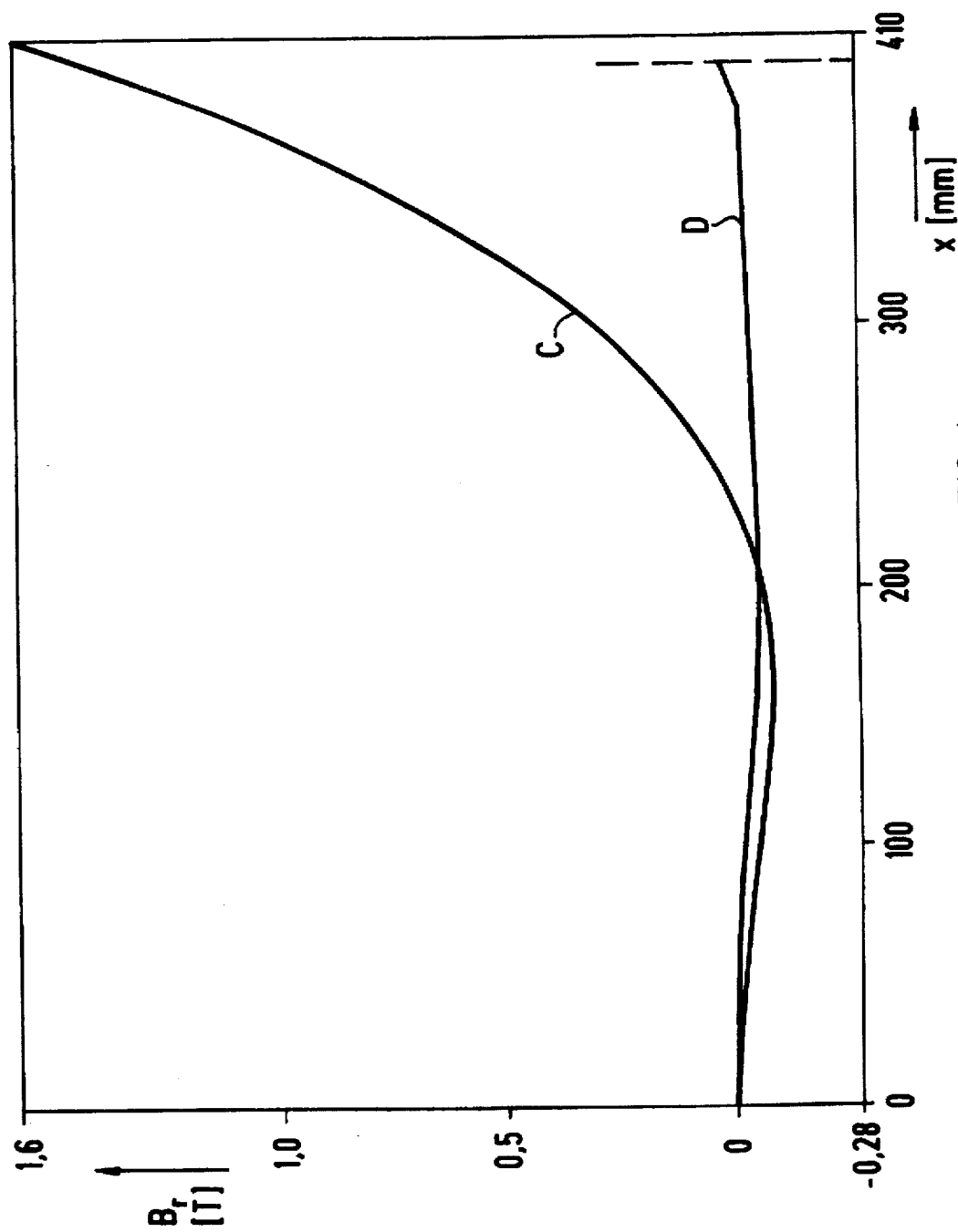
FIG. 4 shows radial flux density components in pole plates.

With the structure of a pole plate 11d according to the invention, only when the middle area 17a, forms a lateral gap 21 relative to a ring-shaped, bead-like edge piece 11c of the base part, and the correction air gap 15 has a conical structure, can a clear reduction in the undesirable radial flux density component in the pole plate 11d be achieved. The diagram of FIG. 4 documents this situation. In this diagram, the radial expanse x of two pole plates, measured in mm from the central axis M, is entered in the direction of the abscissa, and the radial flow density component $B_r$ (in T) which occurs at the bottom of the pole plate in question is entered in the direction of the ordinate. The curve progression indicated as C is obtained for a pole plate which is structured according to FIG. 2 of reference DE-OS 3737133. This pole plate with a radial expanse x of 500 mm essentially consists of electric sheet with a thickness of 15 mm and contains a ring-shaped, bead-like edge piece even in its outer edge area, which is approximately 60 mm wide (in the radial direction). The pole plate is approximately 40 mm thick in the area of this edge piece. Curve D is obtained for a pole plate 11d structured according to the present invention, according to FIG. 2, made of the same material and with the same constant thickness s, but at an appreciable distance from the edge piece 11c. The radial expanse x is 400 mm. As is clearly evident from a comparison of the two curves, an undesirable increase in the radial flux density component $B_r$ is essentially suppressed with the measures according to the invention, especially in the edge area of the pole plate 11d. This occurs because the pole plate 11d is magnetically uncoupled from the base part 11b of the pole shoe as well as from the ring-like edge piece 11c, therefore the parts 11b and 11c essentially carry most of the radial magnetic flux. The concrete progression of the radial flux component $B_r$ is also determined by the conical expansion of the correction air gap 15 and/or the material selection for the plate 11d.

What is claimed is:

1. A homogeneous field magnet comprising:
   a yoke for carrying a magnetic flux; and
   two opposing pole shoes with pole surfaces,
      between which an active volume with a magnetic field of great homogeneity is formed, and
      which are each profiled on the side facing the active volume,
   wherein at least one of the pole shoes contains a pole plate and a base part
   said base part faces said yoke, and
   said pole plate being axially separated from the base part and forming the pole surface of said at least one of the pole shoes, facing the active volume and can be tilted to correct the magnetic field,
   wherein each pole shoe has an edge piece which reduces the reciprocal distance between the pole shoes at its edge area, and the tiltable pole plate of the pole shoe is arranged radially separated from a lateral inner area of the edge piece by a lateral gap.

2. A homogeneous field magnet according to claim 1, wherein the pole plate is composed of several layers.

3. A homogeneous field magnet according to claim 2, wherein the layer of the pole plate which faces the active volume has relatively low electrical conductivity.

4. A homogeneous field magnet according to claim 1, wherein the lateral gap has a width between 2 and 20 mm.

5. A homogeneous field magnet according to claim 1, wherein the pole plate has a constant thickness between 3 and 30 mm.

6. A homogeneous field magnet according to claim 1, wherein an axial separation of the base part and the pole plate forms a correction air gap and the width of the correction air gap at the outer edge of the pole plate is less than the width of the correction air gap at the center of the pole plate.

7. A homogeneous field magnet according to claim 6, wherein the width of the correction air gap at the outer edge of the pole plate is at least 20%, and at most 60% less than the width of the correction air gap at the center of the pole plate.

8. A homogeneous field magnet according to claim 6, wherein the base part of the pole shoe has a corresponding conically lathed area so as to enlarge the correction air gap as the radial distance from the center of the pole plate decreases.

9. A homogeneous field magnet according to claim 1, wherein the area of the pole plate takes up less than 85% of the total surface area of the pole shoe.

10. A homogeneous field magnet comprising:
a yoke for carrying a magnetic flux; and
two opposing pole shoes with pole surfaces,
between which an active volume with a magnetic field of great homogeneity is formed, and
which are each profiled on the side facing the active volume,
wherein at least one of the pole shoes contains a pole plate and a base part
said base part faces said yoke, and
said pole plate being axially separated from the base part and forming the pole surface of said at least one of the pole shoes, facing the active volume and can be bent to correct the magnetic field, wherein each pole shoe has an edge piece which reduces the reciprocal distance between the pole shoes at its edge area, and the bendable pole plate of the pole shoe is arranged radially separated from a lateral inner area of the edge piece by a lateral gap.

11. A homogeneous field magnet according to claim 10, wherein the pole plate is composed of several layers.

12. A homogeneous field magnet according to claim 11, wherein the layer of the pole plate which faces the active volume has relatively low electrical conductivity.

13. A homogeneous field magnet according to claim 10, wherein the lateral gap has a width between 2 and 20 mm.

14. A homogeneous field magnet according to claim 10, wherein the pole plate has a constant thickness between 3 and 30 mm.

15. A homogeneous field magnet according to claim 10, wherein an axial separation of the base part and the pole plate forms a correction air gap and the width of the correction air gap at the outer edge of the pole plate is less than the width of the correction air gap at the center of the pole plate.

16. A homogeneous field magnet according to claim 15, wherein the width of the correction air gap at the outer edge of the pole plate is at least 20%, and at most 60% less than the width of the correction air gap at the center of the pole plate.

17. A homogeneous field magnet according to claim 15, wherein the base part of the pole shoe has a corresponding conically lathed area so as to enlarge the correction air gap as the radial distance from the center of the pole plate decreases.

18. A homogeneous field magnet according to claim 10, wherein that the area of the pole plate takes up less than 85% of the total surface area of the pole shoe.

19. A homogeneous field magnet comprising:
a yoke for carrying a magnetic flux; and
two opposing pole shoes with pole surfaces,
between which an active volume with a magnetic field of great homogeneity is formed, and
which are each profiled on the side facing the active volume,
wherein at least one of pole shoes contains a pole plate and a base part,
said base part faces said yoke, and
said pole plate being axially separated from the base part and forming the pole surface of said at least one pole shoe facing the active volume and can be tilted and bent to correct the magnetic field,
wherein each pole shoe has an edge piece which reduces the reciprocal distance between the pole shoes at its edge area, and the tiltable and bendable pole plate of the pole shoe is arranged separated from a lateral inner area of the edge piece by a lateral gap.

20. A homogeneous field magnet according to claim 19, wherein the pole plate is composed of several layers.

21. A homogeneous field magnet according to claim 20, wherein the layer of the pole plate which faces the active volume has relatively low electrical conductivity.

22. A homogeneous field magnet according to claim 19, wherein the lateral gap has a width between 2 and 20 mm.

23. A homogeneous field magnet according to claim 19, wherein the pole plate has a constant thickness between 3 and 30 mm.

24. A homogeneous field magnet according to claim 19, wherein an axial separation of the base part and the pole plate forms a correction air gap and the width of the correction air gap at the outer edge of the pole plate is less than the width of the correction air gap at the center of the pole plate.

25. A homogeneous field magnet according to claim 24, wherein the width of the correction air gap at the outer edge of the pole plate is at least 20%, and at most 60% less than the width of the correction air gap at the center of the pole plate.

26. A homogeneous field magnet according to claim 24, wherein the base part of the pole shoe has a corresponding conically lathed area so as to enlarge the correction air gap as the radial distance from the center of the pole plate decreases.

27. A homogeneous field magnet according to claim 19, wherein that the area of the pole plate takes up less than 85% of the total surface area of the pole shoe.

* * * * *